(12) United States Patent
Bayless et al.

(10) Patent No.: US 11,195,740 B2
(45) Date of Patent: Dec. 7, 2021

(54) METHODS AND APPARATUS FOR WAFER HANDLING AND PROCESSING

(71) Applicant: Micron Technology, Inc., Boise, ID (US)

(72) Inventors: Andrew M. Bayless, Boise, ID (US); Kyle K. Kirby, Boise, ID (US)

(73) Assignee: Micron Technology, Inc., Boise, ID (US)

(\*) Notice: Subject to any disclaimer, the term of this patent is extended or adjusted under 35 U.S.C. 154(b) by 0 days.

(21) Appl. No.: 16/386,517

(22) Filed: Apr. 17, 2019

(65) Prior Publication Data
US 2020/0335379 A1 Oct. 22, 2020

(51) Int. Cl.
*H01L 21/683* (2006.01)
*H01L 23/48* (2006.01)
*H01L 21/306* (2006.01)

(52) U.S. Cl.
CPC .... *H01L 21/6835* (2013.01); *H01L 21/30604* (2013.01); *H01L 21/30625* (2013.01); *H01L 23/481* (2013.01)

(58) Field of Classification Search
None
See application file for complete search history.

(56) References Cited

U.S. PATENT DOCUMENTS

| | | | |
|---|---|---|---|
| 6,483,187 B1 * | 11/2002 | Chao | H01L 23/3128 257/706 |
| 6,512,302 B2 * | 1/2003 | Mess | H01L 22/26 257/777 |
| 6,939,746 B2 * | 9/2005 | Bolken | H01L 24/28 438/127 |
| 8,461,019 B2 | 6/2013 | Martin et al. | |
| 8,962,449 B1 | 2/2015 | Gandhi | |
| 9,029,238 B2 | 5/2015 | Andry et al. | |
| 9,269,561 B2 | 2/2016 | Dang et al. | |
| 9,305,769 B2 | 4/2016 | Yu et al. | |
| 10,163,693 B1 * | 12/2018 | Bayless | H01L 21/561 |
| 2003/0114016 A1 * | 6/2003 | Tischler | H01L 21/68771 438/758 |
| 2004/0126220 A1 | 7/2004 | Howell et al. | |
| 2008/0136045 A1 * | 6/2008 | Tan | H01L 24/29 257/777 |
| 2014/0057450 A1 | 2/2014 | Bourbina et al. | |
| 2015/0228849 A1 | 8/2015 | Zou et al. | |
| 2016/0133495 A1 | 5/2016 | Andry et al. | |
| 2017/0125268 A1 | 5/2017 | Dang et al. | |
| 2018/0166356 A1 * | 6/2018 | Butt | H01L 23/5383 |

FOREIGN PATENT DOCUMENTS

WO 2014/189739 A1 11/2014

\* cited by examiner

*Primary Examiner* — Long Pham
(74) *Attorney, Agent, or Firm* — TraskBritt

(57) ABSTRACT

An assembly comprising a device wafer received in a recess of a carrier wafer. A device wafer comprising a protrusion terminating at an active surface bearing integrated circuitry, the protrusion surrounded by a peripheral flat extending to an outer periphery of the device wafer. A method of wafer thinning using the previously described carrier wafer and device wafer. Various implementations of a carrier wafer having a recess are also disclosed, as are methods of fabrication.

20 Claims, 8 Drawing Sheets

METHODS AND APPARATUS FOR WAFER HANDLING AND PROCESSING

TECHNICAL FIELD

Embodiments disclosed herein relate to methods and apparatus for semiconductor wafer handling and processing. More particularly, embodiments disclosed herein relate to methods and apparatus for wafer handling offering enhanced protection of wafer edges during handling and processing.

BACKGROUND

While bulk substrates in the form of semiconductor materials take many forms, including layers of semiconductor material carried on substrates of other materials (e.g., glass, sapphire, another insulator), a predominant form of bulk substrate employed in the microelectronics industry for fabrication of semiconductor materials-based microelectronics devices continues to be the semiconductor wafer (e.g., single crystal silicon wafer).

As the industry has progressed over time to enhance integrated circuit density, reduce feature size and yet increase product throughput and yield while accommodating ever-decreasing sizes of devices employing integrated circuitry, semiconductor wafers have become ever-larger in lateral dimension, on the order of 300 mm, while devices fabricated from such wafers have become ever-thinner, on the order of 50 µm or less. In addition, in many instances, for example, memory devices, multiple memory die are stacked vertically, on the order of four, eight, twelve, sixteen or more die, some or all (generally all but an uppermost die) are configured with conductive vias extending vertically therethrough for communication with adjacent die and with circuitry external to the die stack. Such vias, commonly termed "through silicon vias," or "TSVs" are spaced at relatively tight pitches and are formed during wafer processing and prior to singulation of individual die from the wafer.

Semiconductor wafers for use in microelectronic device fabrication, and specifically using the example of silicon wafers, are conventionally provided initially at a nominal thickness of between about 600 µm and about 775 µm. Blind apertures for the fabrication of TSVs are formed from a surface of the wafer as received from a supplier, and are filled with conductive material during one of many acts in the process of fabricating integrated circuitry within and over the active surface of the wafer to form a so-called device wafer including a large number of in-process microelectronic devices such as, for example, memory, logic or processor die. The blind, conductive material-filled apertures must then be exposed from the back side of the device wafer by removing semiconductor material through, for example, back grinding and etching to complete the TSVs. Subsequently, the back side of the thinned device wafer may be passivated, and contact or terminal pads formed over the exposed ends of the TSVs. Optionally, a redistribution layer (RDL) to reroute contact locations for the TSVs may be formed over the back side. The resulting structure, after thinning of the wafer, is rather fragile due to its thinness and incorporation of TSVs.

Referring to FIGS. 1A through 1E of the drawings, a conventional temporary bonding process flow will be described. During handling and processing, a device wafer 100 is supported by a carrier 102, often termed a "carrier wafer" or "handler," similar in size and shape to the device wafer and to which the device wafer is adhesively bonded, and moved from location to location. In one conventional example, a layer of thermoplastic polymer adhesive 104 is used for such bonding, the adhesive applied to the carrier wafer by spin coating. Thickness of the adhesive may be chosen based, for example, on the topography of an active surface 105 of device wafer 100 to be adhered to the carrier wafer 102. Conventionally, the adhesive 104 is disposed to a thickness of between about 5 µm and about 150 µm. One conventional thermoplastic adhesive material used for the adhesive bonding is WaferBOND® HT-10.10, commercially available from Brewer Science, Inc., Rolla, Mo. After application of adhesive 104, carrier wafer 102 with adhesive 104 thereon is baked to remove solvents from the adhesive 104, e.g., solvents within the as-applied adhesive 104 that facilitated application of the adhesive 104.

Referring now to FIG. 1B, the device wafer 100 and the adhesive-coated carrier wafer 102 are bonded together by applying heat and pressure (i.e., Normal force) between the two wafers. For example, the device wafer 100 and the adhesive-coated carrier wafer 102 may be mechanically pressed together under elevated temperature conditions sufficient to soften the adhesive 104 and promote adhesion between the device wafer 100 and the carrier wafer 102. The temperature conditions during bonding may be chosen to approach or exceed a glass transition temperature ($T_g$) of the thermoplastic adhesive material of the adhesive 104. A portion of the softened adhesive 104 may squeeze out around a periphery of an interface 106 between the device wafer 100 and the carrier wafer 102 during bonding. Excess adhesive around the periphery of the interface 106 is removed, e.g., by dissolving the excess adhesive with a solvent.

As previously noted, back side 108 of the device wafer 100 is thinned by a process such as abrasive grinding and/or chemical-mechanical polishing with or without dry etching. The thinning process may reduce the thickness of the device wafer 100 from an initial thickness to a thickness of, for example, about 50 microns or less. As noted above, the thinning process may expose ends of conductive vias in the device wafer 100 on the back side 108 of the thinned device wafer 100 to form TSVs. Passivation and formation of contact pads 110 (shown in FIG. 1C), with or without a redistribution layer (RDL) may follow thinning.

Referring now to FIG. 1D, after thinning and backside processing, the device wafer 100 may be removed from the carrier wafer 102 by heating the polymer adhesive 104 (FIG. 1A) and applying a shear force in direction 112 (i.e., a force generally parallel to the plane of the interface 106 (FIG. 1B) between the device wafer 100 and the carrier wafer 102). Heat-induced softening of the adhesive 104 enables the device wafer 100 to be slid off of the carrier wafer 102. A solvent may be used to clean (i.e., remove) residual adhesive from the device wafer 100, and the device wafer 100 may then be mounted on a film frame support system 114.

As shown in FIG. 1E, the device wafer 100, after being mounted on the film frame support system 114, may be separated, or "singulated," into individual dice 116. The individual dice may then be subsequently packaged or assembled with other dice and packaged to form a semiconductor device or integrated device.

A leading cause of device wafer scrap, and particularly device wafers incorporating TSVs, is edge chipping and cracking. For example, device wafer edges may be easily damaged from wafer edge handling, as well as from contact with structures of a front opening shipping box (FOSB) (see, for example, U.S. Patent Publication 2004/0126220) and front opening unified pod (FOUP) cassette container lids (see, for example, International Patent Publication WO 2014/189739). Further, the volume of adhesive used to bond the device wafer to a carrier wafer must be delicately managed and controlled, to avoid adhesive undercut and lack of support at the device wafer edge from insufficient adhesive volume or squeeze-out and contamination of the device wafer edge and adjacent surface from excessive adhesive volume. As a result of the latter instance, special edge cleaning techniques must be employed, raising costs and slowing throughput.

Further, excess adhesive material that flows from the interface between the device wafer and the carrier wafer may contaminate equipment used for back side processing, leading to costly downtime while the equipment is cleaned.

The inventors herein have recognized the foregoing problems, as well as others, with conventional device wafer handling and processing techniques and developed embodiments of methods and apparatus to address same.

DETAILED DESCRIPTION

Figure 1A:
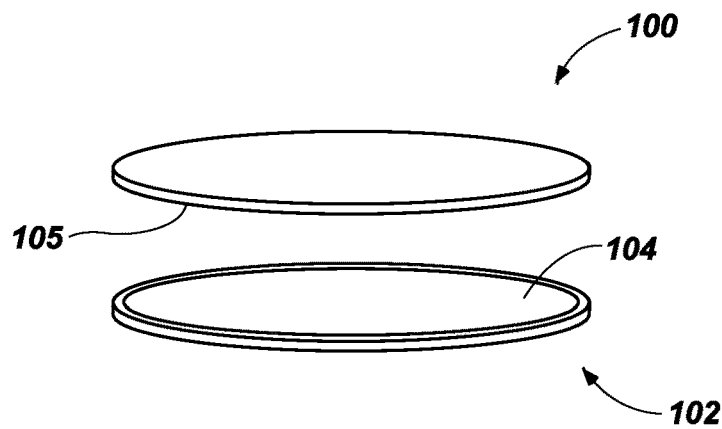
FIGS. 1A-1E depict a conventional device wafer handling process employing in back side processing of the device wafer.
Figure 1B:
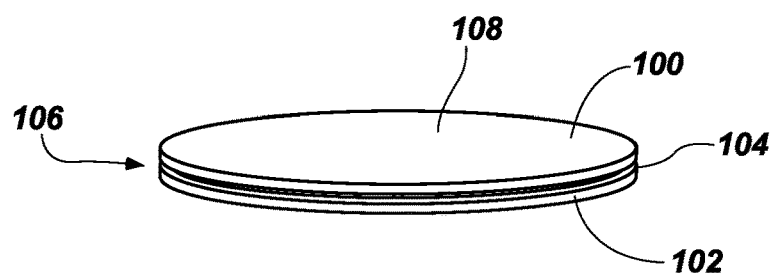
Figure 1C:
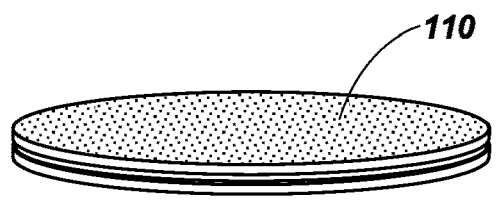
Figure 1D:
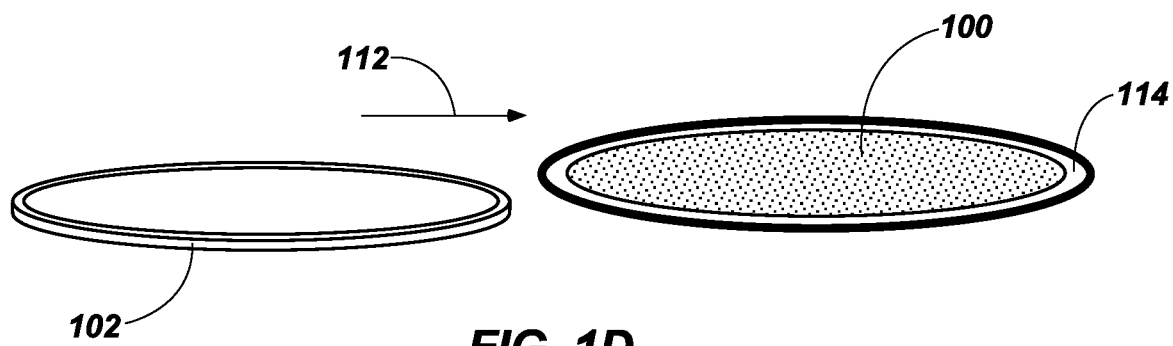
Figure 1E:
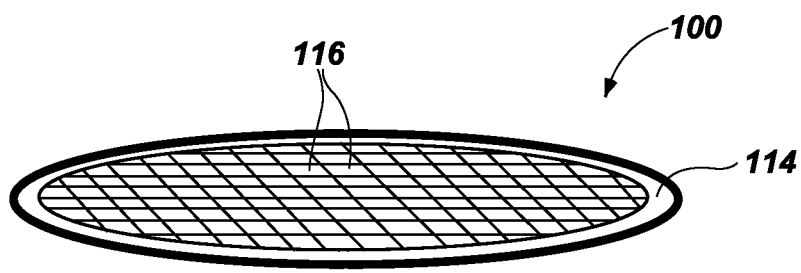

Methods of processing a semiconductor wafer are disclosed, as are embodiments of a carrier wafer suitable for use in implementing the methods. Assemblies comprising a device wafer and carrier wafer both before and after processing according to embodiment of the disclosure are described.

The following description provides specific details, such as sizes, shapes, material compositions, and orientations in order to provide a thorough description of embodiments of the disclosure. However, a person of ordinary skill in the art would understand that the embodiments of the disclosure may be practiced without necessarily employing these specific details. Embodiments of the disclosure may be practiced in conjunction with conventional fabrication techniques employed in the industry. In addition, the description provided below does not form a complete process flow for processing and handling a device wafer, assemblies comprising a device wafer and carrier wafer, or apparatus for processing a device wafer mounted to a carrier wafer according to the disclosure. Only those process acts and structures necessary to understand the embodiments of the disclosure are described in detail below. Additional acts to form a complete, thinned device wafer, a complete, thinned device wafer mounted to a carrier wafer, or a complete, thinned device wafer including TSVs in association with the acts and structures described herein may be performed by conventional fabrication processes.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

As used herein, the term "device wafer" means and includes bulk substrates comprising one or more semiconductor materials and which are susceptible to thinning by removal of semiconductor material from the wafer to achieve a lesser thickness. Such substrates may be configured as conventional, circular wafers, other bulk substrates, or segments of such wafers or bulk substrates. Device wafers may comprise an array of semiconductor die sites, each site comprising integrated circuitry, which die sites may be singulated into individual dice or larger wafer segments. An active surface of a device wafer may have fabricated thereon, before processing in accordance with embodiments of the disclosure, integrated circuitry, and may have additional dice or stacks of dice placed thereon and, optionally encapsulated. It is contemplated that embodiments of the disclosure are particularly suited for implementation with conventional, circular silicon wafers but the disclosure is not so limited.

As used herein the term "carrier wafer" means and includes substrates of a semiconductor, a glass or other suitable material exhibiting sufficient rigidity and a coefficient of thermal expansion (CTE) compatible with a device wafer to be bonded to and support the device wafer for thinning and planarization. It is contemplated, although not required, that a carrier wafer will substantially correspond in size and shape to that of the device wafer.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively larger area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

Figure 2:
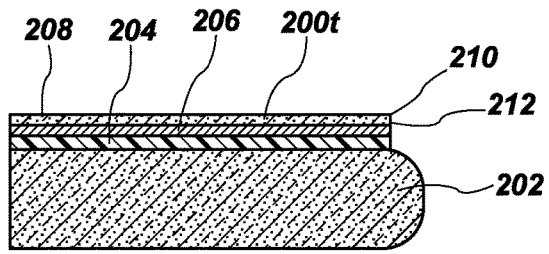
FIG. 2 is a side schematic cross-sectional elevation of a portion of a device wafer adhered to a conventional carrier wafer, after thinning of the device wafer.

FIG. 2 depicts a portion of a device wafer adhered to a conventional carrier wafer 202 by a bonding material 204, after thinning of the device wafer to arrive at thinned device wafer 200$t$, active surface 206 bearing integrated circuitry bonded to carrier wafer 202 by bonding material 204, and the back side 208 of device wafer 200 having been subjected to a thinning operation as previously described. As is shown in FIG. 2, corner 210 of thinned device wafer 200$t$ is highly exposed and susceptible to damage from contact of peripheral edge 212 with equipment during handling and processing.

Suitable bonding materials 204 may include low temperature waxes, hydrocarbon oligomers and polymers, modified acrylates, modified epoxies, modified silicones and high temperature thermoplastic or thermoset polymers. The bonding material 204 may be applied by, for example, spin coating as a liquid or flowable gel, as a tape, or as a preformed film. More specifically, the bonding material 204 may include a thermoset or a thermoplastic polymer material, preferably formulated to withstand high processing temperatures, such as those employed in material deposition, without permitting relative lateral or vertical movement between the carrier wafer 202 and device wafer 200 secured thereto. As a specific, nonlimiting example, the bonding material 204 may include a cured or partially cured thermoset material or a precursor for forming a thermoset material (e.g., silicone adhesive 401LC, commercially available from Shin-Etsu Silicones of America, Inc., 1150 Damar Drive, Akron, Ohio 44305; adhesive BSI.T14049A; adhesive BSI.D16052K, each commercially available from Brewer Science, 2401 Brewer Drive, Rolla, Mo. 65401; or a precursor material or partially cured variant thereof). A thickness of the bonding material 204 may be, for example, between about 0.5 micron and about 5 microns to provide as thin a bond line as possible while maintaining sufficient adherence of the device wafer 200 to the carrier wafer 202. As a specific, nonlimiting example, the thickness of the bonding material 204 may be, for example, between about 2 microns and about 3 microns (e.g., about 2.5 microns). It is desirable that the thickness of bonding material 204 be substantially uniform across the active surface 206 of the carrier wafer 202 to which it is applied before and after device wafer 200 is adhered thereto. In addition to the use of bonding materials, materials for so-called barrier layers susceptible to heating responsive to laser beam impingement as well as release or ablation layers susceptible to ashing responsive to laser beam impingement, are known to those of ordinary skill in the art. Any suitable bonding material, alone or in combination with release or ablation materials and barrier materials may be employed in conjunction with embodiments of the disclosure, none of such embodiments being dependent on the particulars of such materials.

Techniques for debonding of a device wafer from a carrier wafer after processing is largely dependent upon the composition of the bonding material, and may be effected, depending on the bonding material, by solvent release, photodecomposition (e.g., by ultraviolet (UV) or infrared (IR) exposure of the bonding material through the carrier wafer), by thermomechanical techniques, or by thermodecomposition.

Figure 3:
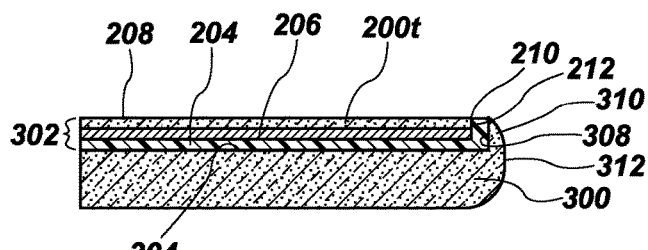
FIG. 3 is a side schematic cross-sectional elevation of a portion of a device wafer adhered to a carrier wafer of an embodiment of the disclosure, after thinning of the device wafer.

FIG. 3 depicts a portion of a thinned device wafer 200t adhered to a carrier wafer 300 of an embodiment of the disclosure by bonding material 204, after thinning of the body of semiconductor material of device wafer 200 to arrive at thinned device wafer 200t. As is readily apparent from FIG. 3, carrier wafer 300 differs significantly from conventional carrier wafer 202 referenced in conjunction with FIG. 2. Specifically, recess 302 having a bottom surface of floor 304, which may also be characterized as a floor, has been formed in a major surface 306 (see FIG. 4A) of carrier wafer 300 from one side thereof, recess 302 being surrounded by sidewall surface 308 of peripheral sidewall 310 between recess 302 and outer peripheral edge 312 of carrier wafer 300. As depicted, bottom surface of floor 304 may be a flat, linearly extending surface. Thinned device wafer 200t, as shown, resides within recess 302 so that device wafer edge 212, and specifically corner 210 thereof, are substantially isolated from contact with external structures by peripheral sidewall 310.

FIGS. 4A through 4E depict a process flow for implementation of a carrier wafer according to embodiments of the disclosure, and for device wafer handling and back side processing using such a carrier wafer.

Figure 4A:
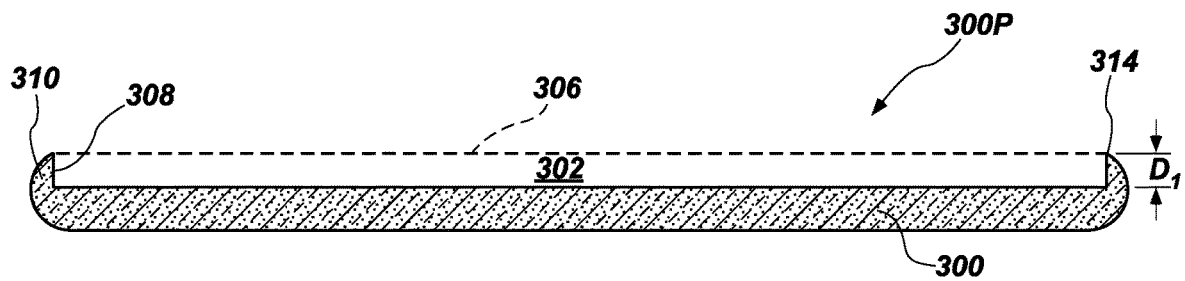
FIGS. 4A-4E are side schematic cross-sectional elevations of a method of processing a device wafer to reach an assembly configured as shown in FIG. 2.

As depicted in FIG. 4A, a carrier wafer precursor structure 300p is provided, of a semiconductor material (e.g., silicon) or a glass material (e.g., soda-lime glass, borosilicate glass). A recess 302 is formed from a major surface 306 (shown in broken lines) of carrier wafer precursor structure 300p to a selected depth $D_1$ sufficient to contain a bonding material and thinned device wafer 200t substantially within the recess 302. In other words, the height of sidewall surface 308 of peripheral sidewall 310 is substantially the same as the thickness of bonding material 204 plus the thickness of thinned device wafer 200t so that the upper extent 314 of peripheral sidewall 310 and the back side 208 of thinned device wafer 200t may be at least substantially coplanar in a horizontal plane, parallel to the back side 208 of thinned device wafer 200t, and back side 208 of thinned device wafer 200t may actually reside below a plane coincident with the upper extent 314 of peripheral sidewall 310 as described below.

Recess 302 may be formed in a carrier wafer precursor structure 300p formed, for example, from single crystal silicon by a grinding process, optionally followed by an etching process. Grinding may be effected by equipment employed in back-grinding device wafers, for example a Taiko back grinding process may be performed by a DAG810 automatic grinder, offered by DISCO Corporation of Tokyo, Japan. An etchant (e.g., tetramethyl ammonium hydroxide (TMAH), TMAH and water (TMAHW), or ammonium hydroxide and water (AHW)) may be employed to remove grind damage to the surface of the floor 304 and sidewall surface 308 and provide a smooth surface topography to increase mechanical strength of carrier wafer 300. If carrier wafer precursor structure 300p comprises a glass, carrier wafer 300 with recess 302 may be formed by molding, or may be formed by a grinding process followed by etching, similar to that used for a silicon precursor structure but using equipment configured for grinding glass and an etchant effective for glass materials (e.g., hydrofluoric acid (HF) in aqueous solution). With either a silicon or a glass carrier wafer precursor structure 300p, the surfaces of the recess may be polished, prior to or in lieu of etching, for a smooth surface topography.

Figure 4B:
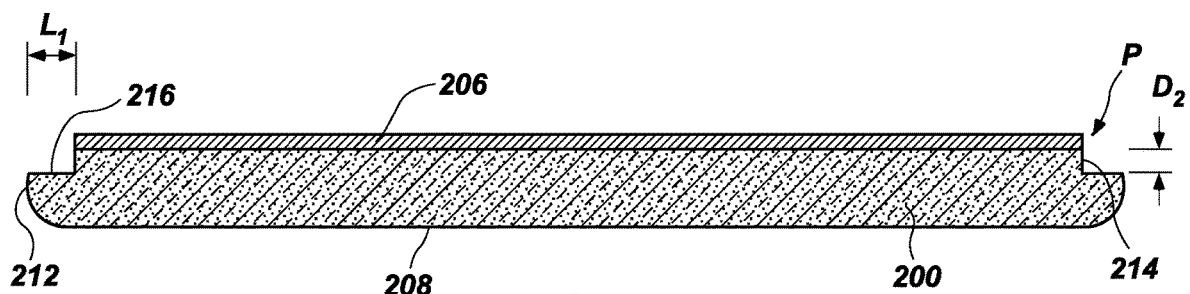

As depicted in FIG. 4B, a device wafer 200 optionally comprising TSV precursor structures (not shown) configured as blind holes formed from a side of device wafer comprising active surface 206 and containing conductive material is provided. Device wafer 200 may then be peripherally thinned using a grinding process from active surface 206 bearing integrated circuitry toward the back side 208 a selected depth $D_2$ greater than depth $D_1$ (FIG. 4A) of recess 302 and of a lateral distance $L_1$ from outer peripheral edge 212 to provide a protrusion P terminating at a laterally extending peripheral flat 216 surrounding protrusion P and extending to outer peripheral edge 212. Protrusion P may be received within recess 302 of carrier wafer 300 (FIG. 4C) with lateral clearance distance $L_2$ between the sidewall 214 of protrusion P and the sidewall surface 308 of peripheral sidewall 310 of carrier wafer 300. Lateral clearance distance $L_2$ is desirably as small as reasonably possible, and within a range of about 10 μm to about 200 μm. Sidewall 214 of protrusion P may, as necessary or desirable, optionally be subjected to a silicon etch to remove any surface damage, or a deposition of a silicon or other material, such as passivation material, to prevent or reduce the potential for chipping or cracking. In the case of a substantially disc-shaped device wafer 200, protrusion P may be of substantially cylindrical shape, sidewall surface 308 of peripheral sidewall 310 may be substantially circular and distance $L_2$ may be a radial distance between the two as measured from a centerline $C_L$ of device wafer.

Figure 4C:
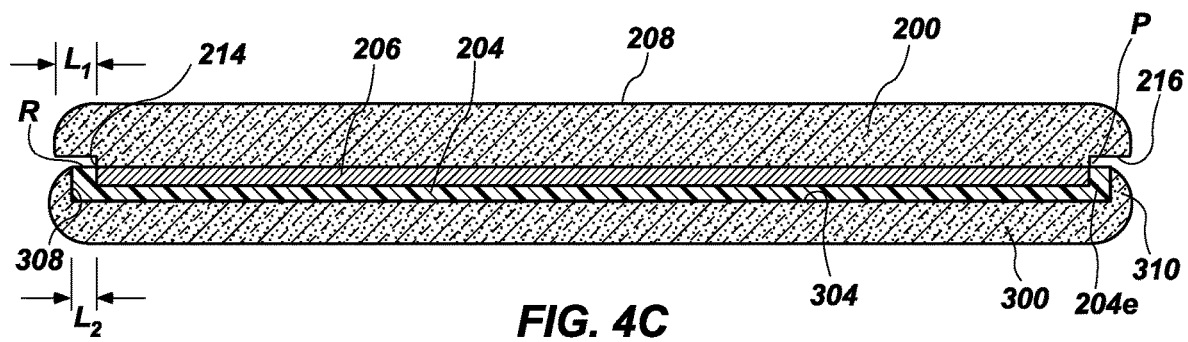

As depicted in FIG. 4C, device wafer 200 is inverted and protrusion P is inserted into recess 302 to contact bonding material 204 on the floor 304 of recess 302, with sidewall 214 spaced from sidewall surface 308, to bond active surface 206 to floor 304 of recess, leaving a substantially annular area between sidewall of protrusion P and sidewall surface 308 of peripheral sidewall 310. Peripheral flat 216 of device wafer 200 may extend laterally over peripheral sidewall 310. As can be seen, bonding material 204 may be pressed laterally from between active surface 206 and floor 304 and extruded upwardly at 204e into a reservoir area R between sidewall 214 of protrusion P and sidewall surface 308. Conventionally, with for example, thermoplastic and thermoset polymer bonding materials, the assembly of the carrier wafer 300 and device wafer 200 may be placed in a heated mechanical press, and sufficient pressure (i.e., Normal force) and temperature are applied to cause the bonding material 204 to flow and fill into the topographical features of the active surface 206 of the device wafer to achieve intimate and continuous contact between the active surface 206 and the floor 304 of the device wafer recess 302 and excess bonding material extruded into reservoir area R.

Figure 4D:
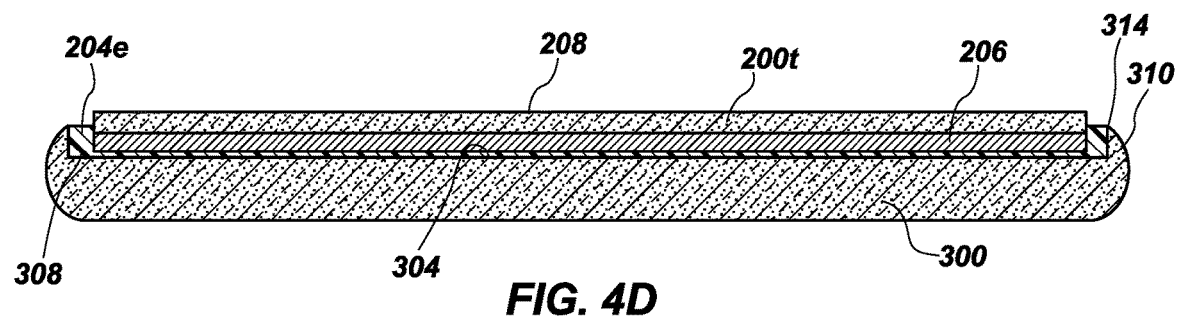

As depicted in FIG. 4D, device wafer 200 is thinned from the back side 208, for example by back grinding, to an elevation closely above (e.g., proximate) or substantially the same as that of the upper extent 314 of peripheral sidewall 310 of carrier wafer 300. Following such thinning, a silicon dry etch (i.e., reactive ion etch) process may then be employed to further reduce the thickness of now-thinned device wafer 200t to a level below the elevation of the upper extent 314 of peripheral sidewall 310 of carrier wafer 300, such process (where applicable to a particular device wafer) also exposing ends of conductors of TSVs of the thinned device wafer 200t. Bonding material 204 extruded upwardly at 204e may also be etched to a desired height below that of peripheral sidewall 310, or removed using a solvent, both of which as known in the art.

Figure 4E:
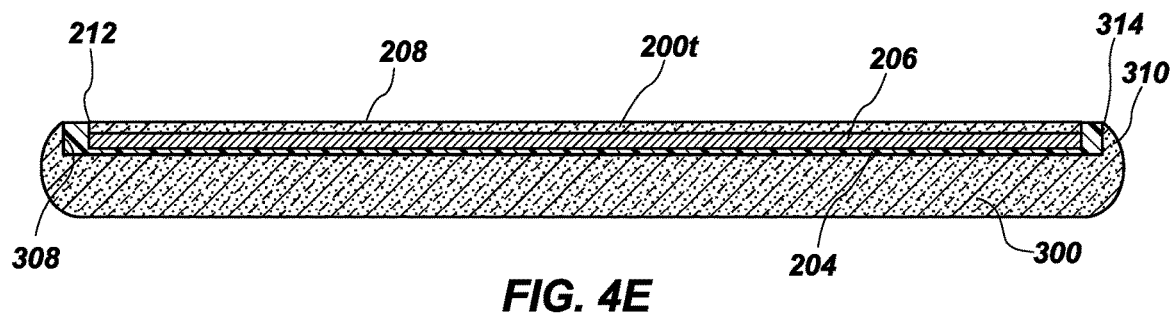

As depicted in FIG. 4E, after the above-described processing, peripheral edge 212 of thinned device wafer 200t resides below the upper extent 314 of peripheral sidewall 310 of carrier wafer 300 and is protected from handling and processing by the carrier wafer 300.

When it is desired to remove thinned device wafer 200t from carrier wafer 300, any conventional debonding and removal technique as described above may be employed. In the case of thermomechanical debond and removal, a twisting, or torsional, force may be applied to thinned device wafer 200t by a carrier temporarily secured (e.g., by a temporary adhesive or a vacuum) to the back side 208 of thinned device wafer 200t after bonding material has been heat-softened sufficiently to release thinned device wafer 200t, as application of a linear shear force as is conventional is precluded by the presence of carrier wafer peripheral sidewall 310. When the carrier wafer comprises glass and the bonding material is susceptible to release responsive to irradiation, a laser release may be employed, using ultraviolet (UV) radiation from, for example, a 250 nm to 400 nm wavelength UV laser. When the carrier wafer comprises silicon and the bonding material is susceptible to release responsive to irradiation, a laser release may be employed, using near infrared (NIR) radiation from, for example, a 1000 nm to 1300 nm wavelength NIR laser. As noted above with respect to bonding materials and other barrier, release or ablation materials, embodiments of the disclosure are not restricted to any particular debond and wafer release process and any conventional bonding material and debond process may be employed.

Referring now to FIGS. 5A through 7E, further embodiments of carrier wafers according to the disclosure and methods of fabrication are described. It is noted that the curvatures and overall configurations of the recesses of the depicted carrier wafers may, in some instances, be exaggerated for clarity.

Figure 5A:
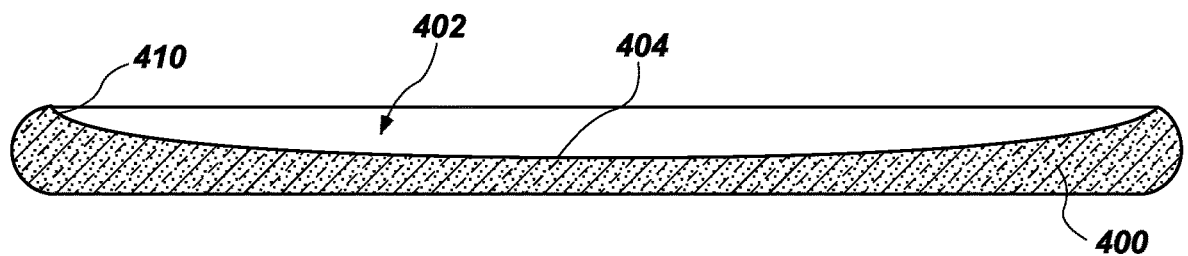
FIG. 5A is a side schematic cross-sectional elevation of another embodiment of carrier wafer suitable for use in implementation of semiconductor wafer processing according to the disclosure and FIG. 5B is a side schematic cross-sectional elevation of a variation of the embodiment of FIG. 5A.
Figure 5B:
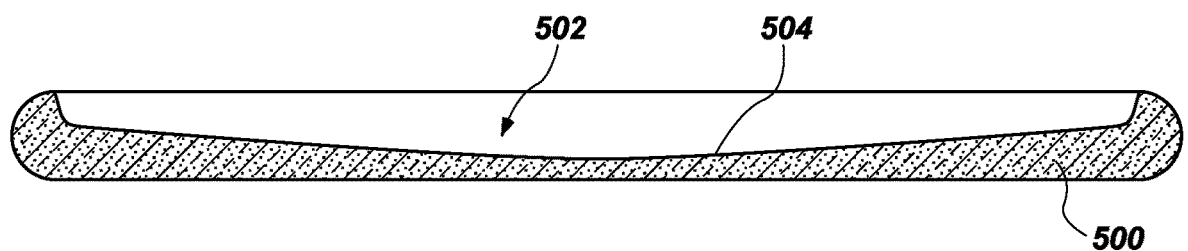

FIG. 5A depicts a carrier wafer 400 in which recess 402 is configured with shallow arcuate, concave bottom surface 404 terminating at an upstanding curved peripheral surface 410 of relatively small radius. Such a configuration, of substantially trued "dished" shape, may be formed using a grinding wheel in a sweeping motion, or the carrier wafer may be "turned" with a lathe-type motion. FIG. 5B is similar to FIG. 5A, except that recess 502 of carrier wafer 500 is configured with a very shallow, substantially cone-shaped bottom surface 504 which, again, may be achieved using a different, less complex setup for the grind process. In either case, after grinding either a silicon or a glass carrier substrate precursor, surface topography of the recess may be smoothed using an etchant and, optionally, a polishing mechanism.

Figure 6:
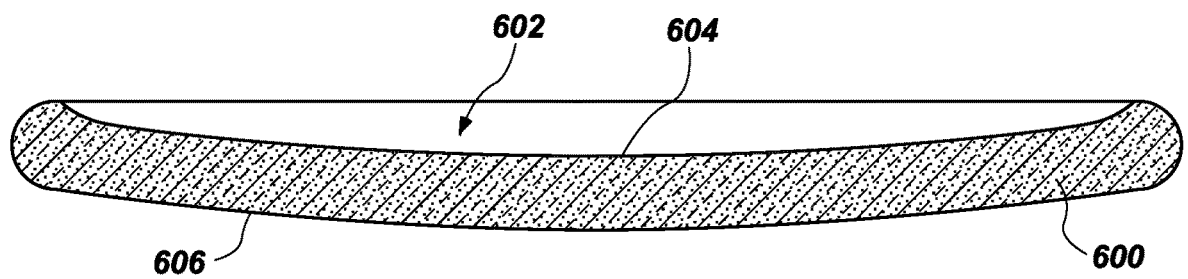
FIG. 6 is a side schematic cross-sectional elevation of a further embodiment of carrier wafer suitable for use in implementation of semiconductor wafer processing according to the disclosure.

FIG. 6 depicts a carrier wafer 600 formed into a "cup" shape with a substantially concave, arcuate, dished bottom surface 604 of recess 602. The surface 606 of the body of carrier wafer 600 opposite bottom surface 604 is similarly arcuate and dished in a same direction as bottom surface 604 to form a substantially convex surface. Such a shape may be achieved by forming the carrier wafer precursor initially in a planar shape, and then heating and forming to the final shape over a curved jig. Such a shape may also be achieved by using a pressure jig with applied vacuum or suction to hold and form carrier wafer 600 as the material of the carrier wafer precursor relaxes.

Figure 7:
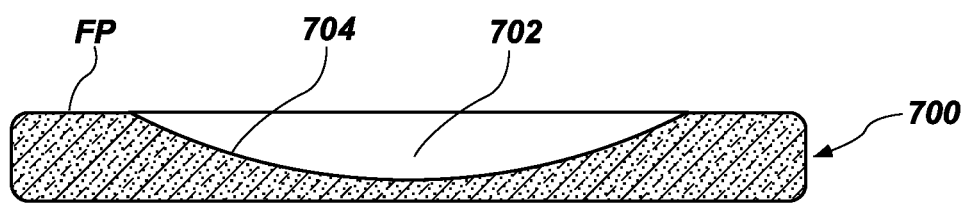
FIG. 7 is a side schematic cross-sectional elevation of a further embodiment of carrier wafer suitable for use in implementation of semiconductor wafer processing according to the disclosure.
Figure 7A:
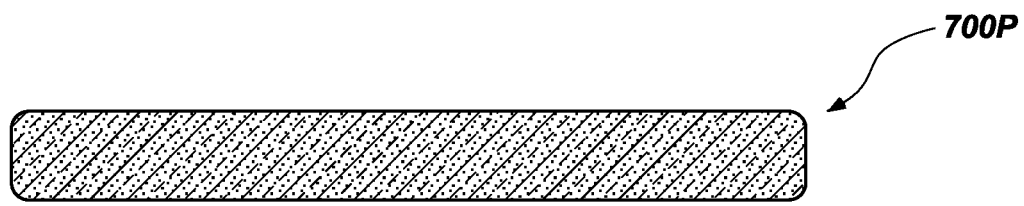
FIGS. 7A Through 7E are schematic depictions of an example method of fabricating the carrier wafer of FIG. 7.
Figure 7B:
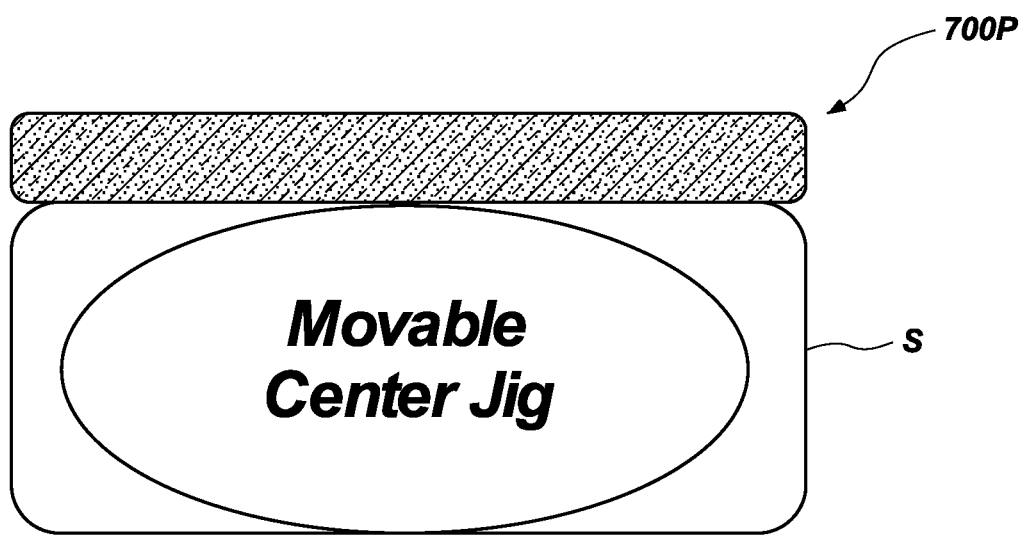
Figure 7C:
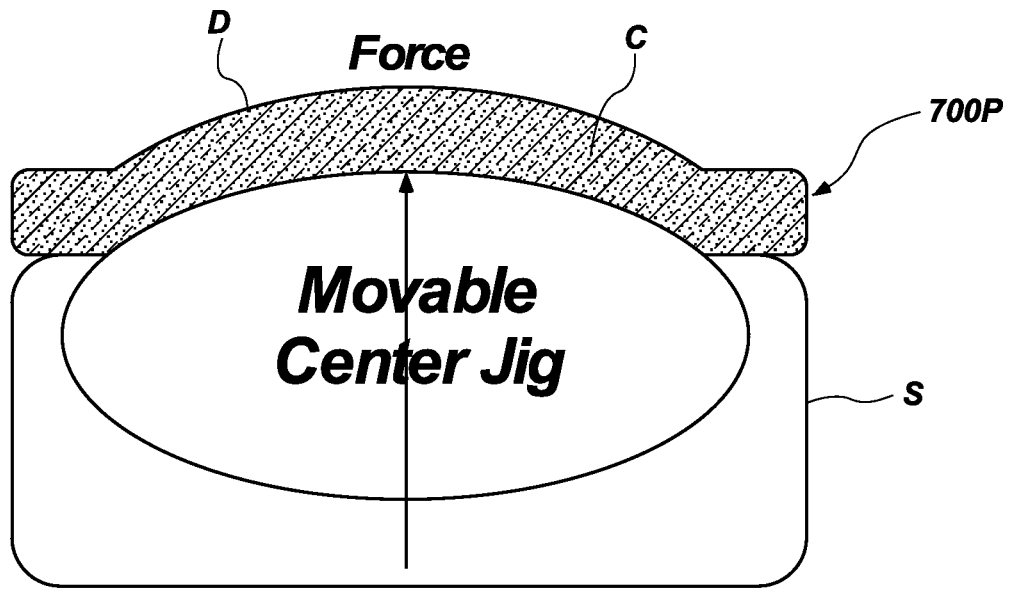
Figure 7D:
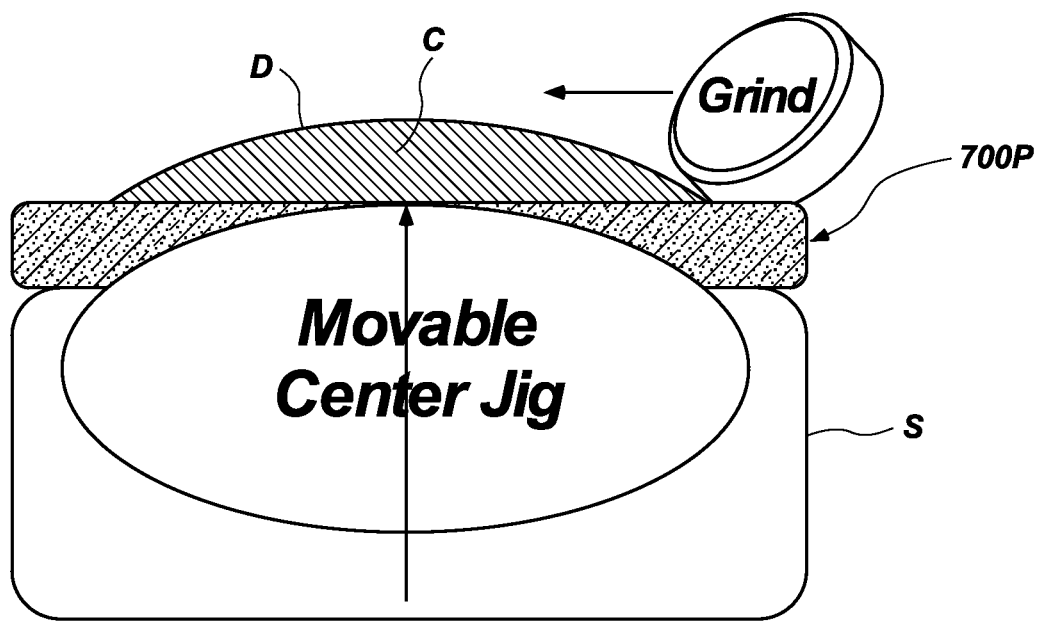
Figure 7E:
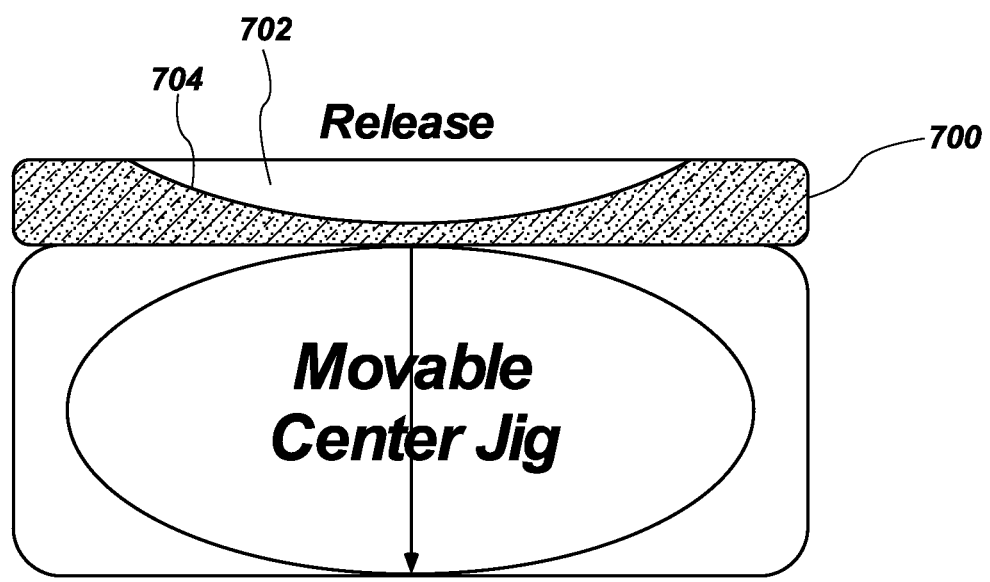

FIG. 7 depicts a carrier wafer 700 comprising a dished recess 702 having a substantially concave bottom surface 704 leading to a flat, peripheral portion FP of the major surface of carrier wafer 700 into which dished recess 702 has been formed. 704. To form carrier wafer 700, as illustrated in FIGS. 7A through 7E, a planar, full-thickness carrier wafer precursor 700P is provided as depicted in FIG. 7A, and as depicted in FIG. 7B, carrier wafer precursor 700P is secured in place over a movable center jig J, after which as depicted in FIG. 7C, center jig J is moved upwardly as shown by the arrow to apply stress and force a center region C of carrier wafer precursor 700P into a domed shape D in an elastic strain response of the wafer material. A portion of material forming domed shape D is then removed, as by grinding across the material of the dome in a linear motion as shown by the arrow in FIG. 7D, parallel to the former major plane of carrier wafer 700P as shown in FIGS. 7A and 7B. Center jig J is then moved downwardly as depicted in FIG. 7D to release the stress on carrier wafer precursor 700P, upon which release of stress carrier wafer precursor 700P relaxes as shown in FIG. 7E, to form carrier wafer 700 as shown in FIG. 7.

It should be noted that bonding material may be applied to either the device wafer or the carrier wafer prior to lamination of the two wafers. With respect to the embodiments of FIGS. 5A through 7, wherein the respective recesses have non-linear bottom surfaces, it is noted that even full-thickness silicon device wafers can flex a few millimeters without breaking, and wafers thinned below 100 μm can actually curl up on themselves without breaking. Therefore, for implementation of such embodiments, the curvature or other nonlinearity of the carrier wafer recess bottom may be tuned to accommodate the bending stress to which a particular device wafer configuration may be subjected without cracking or other degradation. Similarly, back grinding processes may be tailored in terms of applied force and path of the grinding wheel to gradually adjust the Normal force applied to portions of a device wafer as is thinned to avoid damage. In addition, the shape of the grinding wheel may be tuned to accomplish the desired carrier wafer recess bottom configuration.

As will be appreciated by those of ordinary skill in the art, implementation of embodiments of the present disclosure may provide numerous advantages in comparison to state of the art apparatus and methods for device wafer handling. For example, and not by way of limitation, improved die yield per wafer may result from the protected edge of the thinned wafer, the potential for wafer edge chipping from edge handling is reduced due to protection by the carrier wafer, and a propensity for wafer cracking loss may be reduced as a result of edge chip initiation point elimination during de-bond of the device wafer from the carrier wafer. Further, due to the support afforded by the carrier wafer and peripheral edge protection by the carrier wafer sidewall, handling of extremely thin wafers, on the order of 30 μm or less, may be enabled while maintaining die yield.

In addition, and again by way of example and not limitation, implementation of embodiments of the disclosure poses less risk for downstream tool contamination by bonding material due to containment by the carrier wafer. Similarly, "squeeze out" of bonding material from between the edge of the device wafer and carrier is eliminated by the reservoir provided in the carrier wafer recess by space between the device wafer edge and the sidewall surface of the carrier wafer sidewall. Further, due to the reservoir, sufficient bonding material may be provided between the device wafer and the carrier wafer to ensure complete coverage between the two wafers to, and beyond, the device wafer edge, eliminating any potential for adhesive undercut. In another advantageous aspect of implementation of embodiments of the disclosure, no special edge cleaning equipment or process is required, the carrier wafer configuration and processing is adaptable to all existing temporary carrier methodologies, and carrier wafers configured according to embodiments of the disclosure may be reused after cleaning and recycled in device wafer processing multiple times.

In an embodiment, an assembly comprises a carrier wafer including a recess having a flat bottom surface surrounded by a peripheral sidewall and a device wafer having an active surface secured to the bottom surface of the recess with a bonding material, a combined thickness of the device wafer and the bonding material being no more than substantially a depth of the recess from the bottom surface to an upper extent of the peripheral sidewall.

In another embodiment, A device wafer comprises a body of semiconductor material having a lateral extent, an active surface bearing integrated circuitry over one side of the body, the active surface extending to a peripheral sidewall of lesser lateral extent than the lateral extent of the body and extending from and perpendicular to the active surface to a peripheral flat perpendicular to and surrounding the peripheral sidewall and extending laterally outwardly to a periphery of the body.

In a further embodiment, a method comprises inserting a portion of a device wafer comprising an active surface bearing integrated circuitry into a recess of a carrier wafer, the portion of the device wafer comprising a protrusion defined by a sidewall of a body of semiconductor material of the device wafer and surrounded by a peripheral flat of the body extending to a lateral periphery of the device wafer, the peripheral flat extending laterally over a sidewall of the recess of the carrier wafer, and securing the device wafer by the active surface to a bottom surface of the recess of the carrier wafer with at least a bonding material.

In a yet further embodiment, a carrier wafer for supporting a device wafer thereon comprises a body having a recess sized for receiving a device wafer at least partially therein, the recess having a nonlinear bottom surface.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An assembly, comprising:
   a carrier wafer including a recess having a flat bottom surface surrounded by a peripheral sidewall; and
   a device wafer comprising an array of unsingulated semiconductor die sites each having an active surface comprising integrated circuitry, the active surface of the device wafer secured directly to the flat bottom surface of the recess with a bonding material, a combined thickness of the device wafer and the bonding material being no more than substantially a depth of the recess from the flat bottom surface to an upper extent of the peripheral sidewall;
   wherein a back side surface of the device is wafer exposed.

2. The assembly of claim 1, wherein the combined thickness of the device wafer and the bonding material is less than the depth of the recess from the flat bottom surface to the upper extent of the peripheral sidewall.

3. The assembly of claim 1, wherein the carrier wafer comprises silicon or a glass.

4. The assembly of claim 1, wherein the device wafer has a thickness of about 50 μm or less.

5. The assembly of claim 1, wherein the bonding material comprises a high temperature thermoset polymer, a high temperature thermoplastic polymer, a low temperature wax, a hydrocarbon oligomer, a hydrocarbon polymer, a modified acrylate, a modified epoxy, or a modified silicone.

6. The assembly of claim 1, wherein each of the device wafer and the carrier wafer are substantially circular.

7. The assembly of claim 6, further comprising a substantially annular area between an outer periphery of the device wafer and a surface of the peripheral sidewall of the carrier wafer.

8. The assembly of claim 1, wherein the peripheral sidewall of the carrier wafer is oriented perpendicular to the bottom surface of the recess.

9. The assembly of claim 1, wherein a thickness of the bonding material is between about 0.5 micron and about 5 microns.

10. The assembly of claim 7, wherein the substantially annular area between the outer periphery of the device wafer and a surface of the peripheral sidewall of the carrier wafer is substantially filled with the bonding material.

11. An assembly, comprising:
    a carrier wafer including a cavity having a flat floor surrounded by a peripheral sidewall; and
    a device wafer comprising an array of unsingulated semiconductor die sites, having an uncovered back side surface, and having an active surface adhered directly to the flat floor of the cavity with a bonding material, a combined thickness of the device wafer and the bonding material being equal to or less than substantially a depth of the cavity from the flat floor to a top of the peripheral sidewall.

12. The assembly of claim 11, wherein the combined thickness of the device wafer and the bonding material is less than the depth of the cavity from the flat floor to the top of the peripheral sidewall.

13. The assembly of claim 11, wherein the carrier wafer comprises a material having a coefficient of thermal expansion (CTE) compatible with a CTE of the device wafer.

14. The assembly of claim 11, wherein the device wafer has a thickness of no more than about 50 μm.

15. The assembly of claim 11, wherein the bonding material is selected from the group consisting of a high temperature thermoset polymer, a high temperature thermoplastic polymer, a low temperature wax, a hydrocarbon oligomer, a hydrocarbon polymer, a modified acrylate, a modified epoxy, and a modified silicone.

16. The assembly of claim 11, wherein both the device wafer and the carrier wafer are substantially circular.

17. The assembly of claim 11, further comprising a substantially annular lateral gap between an outer periphery of the device wafer and an inner surface of the peripheral sidewall of the carrier wafer.

18. The assembly of claim 11, wherein an inner surface of the peripheral sidewall of the carrier wafer is oriented perpendicular to the floor of the cavity.

19. The assembly of claim 11, wherein a thickness of the bonding material no less than about 0.5 micron and no more than about 5 microns.

20. The assembly of claim 17, wherein the substantially annular lateral gap between the outer periphery of the device wafer and the inner surface of the peripheral sidewall of the carrier wafer is filled with the bonding material to a height less than a height of the peripheral sidewall.

\* \* \* \* \*